US006844796B2

(12) United States Patent
Taki et al.

(10) Patent No.: US 6,844,796 B2
(45) Date of Patent: Jan. 18, 2005

(54) DIELECTRIC FILTER HAVING INCREASED BANDWIDTH

(75) Inventors: Hideaki Taki, Ise (JP); Kazuto Fuzisaka, Ise (JP)

(73) Assignee: NGK Spark Plug Co., Ltd., Nagayo (JP)

( * ) Notice: Subject to any disclaimer, the term of this patent is extended or adjusted under 35 U.S.C. 154(b) by 28 days.

(21) Appl. No.: 10/395,303

(22) Filed: Mar. 25, 2003

(65) Prior Publication Data

US 2003/0184414 A1 Oct. 2, 2003

(30) Foreign Application Priority Data

Mar. 29, 2002 (JP) ....................................... 2002-094658

(51) Int. Cl.[7] ............................ H01P 1/213; H03K 5/00
(52) U.S. Cl. ........................ 333/206; 333/202; 333/134
(58) Field of Search ................................ 333/202, 206, 333/207, 202 DB, 222, 223

(56) References Cited

U.S. PATENT DOCUMENTS

| | | | | | |
|---|---|---|---|---|---|
| 5,218,329 | A | * | 6/1993 | Vangala et al. | 333/206 |
| 5,506,554 | A | | 4/1996 | Ala-Kojola | 333/206 |
| 5,652,555 | A | * | 7/1997 | Tada et al. | 333/202 |
| 5,831,495 | A | * | 11/1998 | Hino | 333/202 |
| 6,235,341 | B1 | * | 5/2001 | Hino | 427/126.2 |
| 6,504,455 | B2 | * | 1/2003 | Toda et al. | 333/202 |
| 6,680,661 | B2 | * | 1/2004 | Hiroshima et al. | 333/134 |
| 2002/0022948 | A1 | | 2/2002 | Okada et al. | |

FOREIGN PATENT DOCUMENTS

| | | | |
|---|---|---|---|
| EP | 1 098 384 | A3 | 5/2002 |
| GB | 2 359 420 | A | 8/2001 |
| GB | 2 374 985 | A | 10/2002 |
| GB | 2 382 234 | A | 5/2003 |
| JP | 110340708 | A | 12/1999 |
| JP | 2001284905 | | 10/2001 |

* cited by examiner

*Primary Examiner*—Dinh T. Le
(74) *Attorney, Agent, or Firm*—Stites & Harbison PLLC; Ross F. Hunt, Jr.

(57) ABSTRACT

A dielectric filter includes a plurality of resonators provided in a dielectric block in parallel to each other. Each resonator is formed through providing an inner conductor on a wall surface of a through-hole extending between first and second end surfaces of the block. An outer conductor is provided on end and side surfaces of the block except for the first end surface. The inner conductor and the outer conductor are connected together so that the second end surface serves as a short circuit end surface, and the first end surface serves as an open end surface. A pair of input-output terminals are provided on a side surface of the block so that the input-output terminals are located adjacent to the open end surface at respective positions corresponding to open ends of two of the resonators. Insulating sections on the side surface isolate corresponding input-output terminals from the outer conductor formed on the side surface of the block. A section without a conductor thereon is used in controlling filter characteristics. This section is provided on the side surface between the input-output terminals and extends for a predetermined distance along the insulating sections from an edge between the side surface and the open end surface.

6 Claims, 5 Drawing Sheets

PRIOR ART

PRIOR ART

DIELECTRIC FILTER HAVING INCREASED BANDWIDTH

BACKGROUND OF THE INVENTION

1. Field of the Invention

The present invention relates to dielectric filters of the type including a plurality of dielectric resonators.

2. Related Art

A dielectric filter of the type referred to above is shown in FIG. 8 which illustrates an exemplary embodiment of such a dielectric filter. In FIG. 8, the dielectric filter includes a dielectric block A and a plurality of resonators provided in the dielectric block A in parallel to each other. Each resonator is formed by providing an inner conductor C on a corresponding wall surface of a through-hole B extending from a first end surface A1 of the dielectric block to a second end surface A2 of the dielectric block opposite the first end surface A1. An outer conductor D is provided on the circumferential surface (i.e., the side and end wall surfaces) of the dielectric block A except for the first end surface A1 of the dielectric block A. The inner conductor C provided on the wall surface of each through-hole B and the outer conductor D provided on the circumferential surface of the dielectric block A are connected with each other so that the second end of end wall surface A2 serves as a short circuit end surface. The first end or end wall surface A1 serves as an open end surface or open circuit end surface. A variety of different dielectric filters of a similar structure have been proposed, and these filters are typically employed as high-frequency band filters.

In the dielectric filter of FIG. 8, a pair of input-output terminals E1 and E2 are provided on a side surface A3 of the dielectric block A so that the input-output terminals E1 and E2 are located adjacent to the open end surface at respective positions corresponding to open ends of two of the resonators. Around the input-output terminals E1 and E2, insulating sections F1 and F2 are provided in such a manner that each insulating section isolates a corresponding one of the input-output terminals E1 and E2 from the outer conductor D formed on the side surface A3 of the dielectric block A. In order to lower production costs and increase productivity, the input-output terminals E1 and E2 are generally formed after the production of a plurality of the filter elements each including a plurality of dielectric resonators. More specifically, the plurality of filter elements are held together by means of a jig, and a silver paste is applied to the filter elements through screen printing, while areas corresponding to insulating sections F1 and F2 which define the terminals E1 and E2 are masked, to thereby form the conductor layer D. Therefore, the conductor layer D remains between the insulating sections F1 and F2.

In conventional dielectric filters such as that shown in FIG. 8, the outer conductor present between the insulating sections defining the pair of input-output terminals serves the function of preventing magnetic field coupling. However, this outer conductor also narrows the bandwidth of the filter. In the latter regard, the filtering characteristics of such a conventional filter are shown in FIG. 9.

SUMMARY OF THE INVENTION

In view of the foregoing, an object of the present invention is to solve the aforementioned problem caused by the outer conductor being present between the input-output terminals. A further object of the present invention is to provide a dielectric filter which has broadband filter characteristics.

In order to achieve the above objects, there is provided, in accordance with the present invention, a dielectric filter including: a dielectric block having end and side surfaces; a plurality of resonators provided in the dielectric block in parallel with each other, each of the resonators comprising an inner conductor on a wall surface of a through-hole extending from a first end surface of the dielectric block to a second end surface of the dielectric block opposite the first end surface; and an outer conductor on the end and side surfaces of the dielectric block except for the first end surface, the inner conductor provided on the wall surface of each through-hole and the outer conductor provided on the circumferential surface of the dielectric block being connected together so that the second end surface serves as a short circuit end surface, and the first end surface serves as an open end surface, and the dielectric filter further comprising: a pair of input-output terminals disposed on one side surface of the dielectric block such that the input-output terminals are located adjacent to the open end surface at respective positions corresponding to open ends of two of the resonators; insulating sections disposed on the one side surface in such a manner that each insulating section isolates a corresponding one of the input-output terminals from the outer conductor formed on the one side surface of the dielectric block; and a further section without a conductor thereon for controlling filter characteristics of the dielectric filter, the further section being disposed on the one side surface between the input-output terminals, and extending over a predetermined distance along the insulating sections from an edge between the one side surface and the open end surface.

Preferably, the further section for controlling the filter characteristics of the filter has dimensions such as to prevent magnetic field coupling between the resonators.

In one embodiment of the present invention, the further section is formed through removing, by cutting away or the like, a part of the outer conductor formed on the one side surface of the dielectric block.

Further features and advantages of the present invention will be set forth in, or apparent from, the detailed description of preferred embodiments thereof which follows.

DESCRIPTION OF THE PREFERRED EMBODIMENTS

Preferred embodiments of the present invention will now be described with reference to the accompanying drawings, FIGS. 1 to 7.

Figure 1:
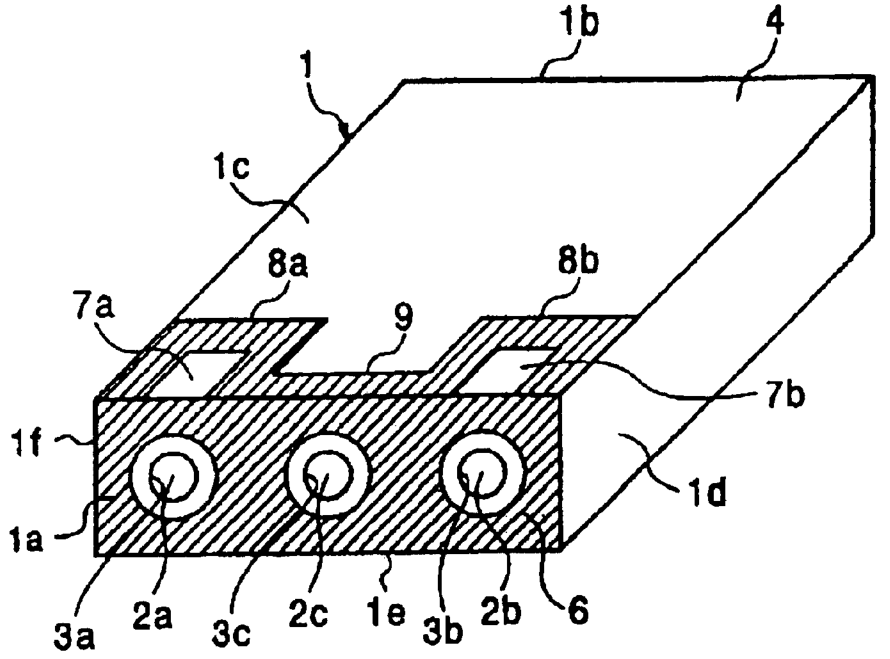
FIG. 1 is a schematic perspective view of a three-stage dielectric filter for high-frequency use, according to one embodiment of the present invention.
Figure 2:
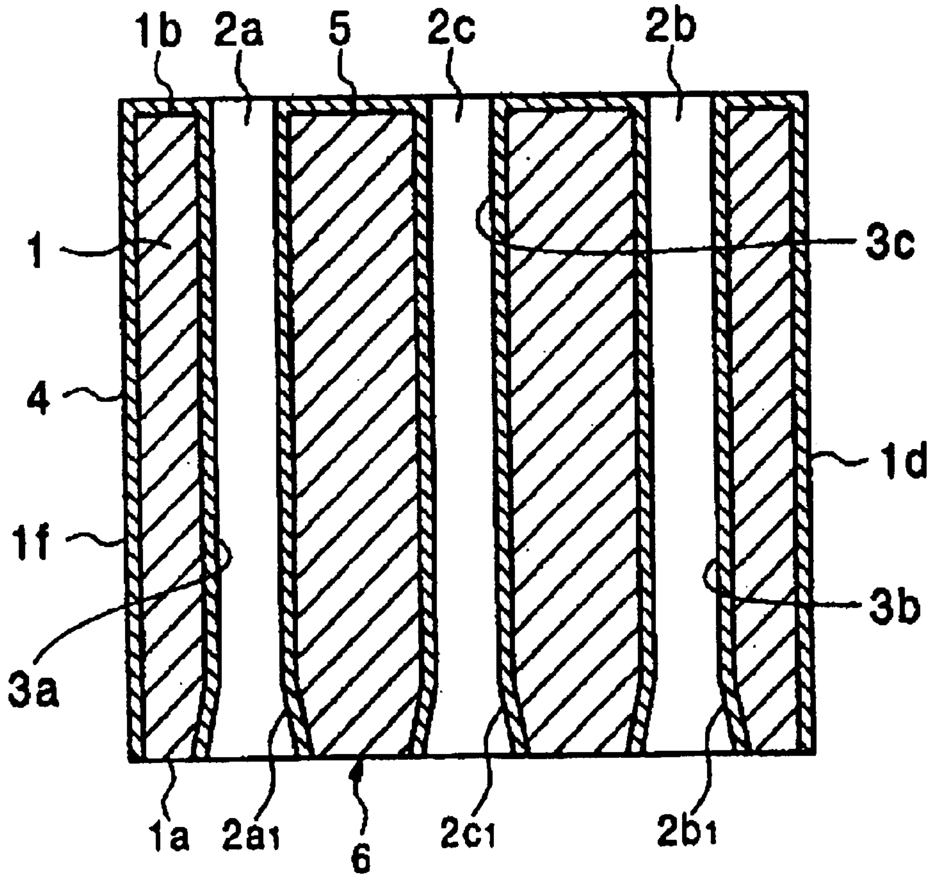
FIG. 2 is a schematic cross-sectional view of the dielectric filter of FIG. 1.

FIG. 1 shows a three-stage dielectric filter for high-frequency use comprising a single dielectric block 1 in which three dielectric co-axial resonators are provided. The dielectric block 1 is preferably made of a dielectric ceramic such as BaO—$TiO_2$ or BaO—$TiO_2$-(rare earth oxide) and has the shape of a rectangular prism having a first end surface 1*a*, a second end surface 1*b*, and four side surfaces 1*c*, 1*d*, 1*e*, and 1*f*. In the dielectric block 1, three through-holes 2*a*, 2*b*, and 2*c*, extending from the first end surface 1*a* to the second end surface 1*b*, are formed in parallel. As shown in FIG. 2, portions of increased diameter, denoted $2a_1$, $2b_1$, and $2c_1$, are formed at the first ends of through-holes 2*a*, 2*b*, and 2*c*, respectively, whereby the capacitances thereof are increased. Inner conductors 3*a*, 3*b*, and 3*c* are formed by coating of the inner wall surfaces of the corresponding through-holes 2*a*, 2*b*, and 2*c*, thereby forming three dielectric resonators.

An outer conductor 4 serving as a ground or earth conductor is formed on the side surfaces 1*c*, 1*d*, 1*e*, and 1*f* of the dielectric block 1. As shown in FIG. 2, a short circuit conductor 5 connected to the outer conductor 4 formed on the side surfaces 1*c*, 1*d*, 1*e*, and If is formed on the second end surface 1*b* of the dielectric block 1. The short circuit conductor 5 connects the inner conductors 3*a*, 3*b*, and 3*c* of the corresponding dielectric resonators to the outer conductor 4, to thereby form a short circuit end surface. No conductor is formed on the first end surface 1*a* of the dielectric block 1 so that the first end surface 1*a* serves as an open or open circuit end surface 6.

A pair of input-output terminals 7*a* and 7*b* are formed on the side surface 1*c* of the dielectric block 1. The input-output terminals 7*a* and 7*b* are insulated from the outer conductor 4 by "conductor-absent" sections, i.e., insulating sections 8*a* and 8*b* wherein no conductor is present.

The input-output terminals 7*a* and 7*b* may be formed by two methods. In the first method, during formation of the outer conductor 4 on the side surface of the dielectric block 1, the input-output terminals 7*a* and 7*b* are formed through screen printing, while the areas corresponding to the insulating sections 8*a* and 8*b* are masked. In the second method, after formation of the outer conductor 4 on the side of the dielectric block 1, portions of the outer conductor 4 corresponding to the insulating sections 8*a* and 8*b* which define the input-output terminals 7*a* and 7*b*, are cut away or otherwise removed by use of an appropriate cutting or grinding means such as a laser trimmer or a sand blasting unit.

One input-output terminal 7*a* is capacitively connected with the inner conductor 3*a* via the dielectric block 1, and in a similar manner, the other input-output terminal 7*b* is capacitively connected with the inner conductor 3*b* via the dielectric block 1. The overall filter device is connected to an electrical path or connection in such a manner that one of these input-output terminals 7*a* and 7*b* serves as an input terminal, and the other one serves as an output terminal, so that electrical connection of the high-frequency dielectric filter is established.

A key feature of the dielectric filter of the present invention will next be described.

As shown in FIG. 1, a further "conductor-absent" section 9, which is used for controlling filter characteristics, is provided between the insulating sections 8*a* and 8*b*. The latter define the input-output terminals 7*a* and 7*b* formed on the side surface 1*c* of the dielectric block 1, with the terminals 7*a* and 7*b* being located adjacent to the first end surface 1*a*, i.e., the open end surface 6, of the dielectric block 1. The conductor-absent section 9 extends from an edge between the side surface 1*c* and the open end surface 6, along the insulating sections 8*a* and 8*b*, to a terminating point, over a distance which is approximately ⅓ the length of the insulating sections 8*a* and 8*b*. The conductor-absent section 9 may be formed by partially cutting or otherwise removing the outer conductor 4 by means of an appropriate cutting or grinding means such as a laser trimmer or a sand blasting unit. In this case, the conductor-absent section 9 may be formed simultaneously with formation of the insulating sections 8*a* and 8*b*, or independently of the formation of the insulating sections 8*a* and 8*b*.

Exemplary specific dimensions of the thus-formed dielectric filter shown in FIG. 1 are as follows:

Dielectric substrate 1: about 4.5 mm in length, about 4 mm in width, and about 2.0 mm in height;

Longitudinal length of the insulating sections 8*a* and 8*b* defining the input-output terminals 7*a* and 7*b*: about 1.5 mm;

Distance between the insulating sections 8*a* and 8*b* defining the input-output terminals 7*a* and 7*b*: about 0.5 mm; and Longitudinal length of the conductor-absent section 9: about 0.5 mm.

Figure 3:
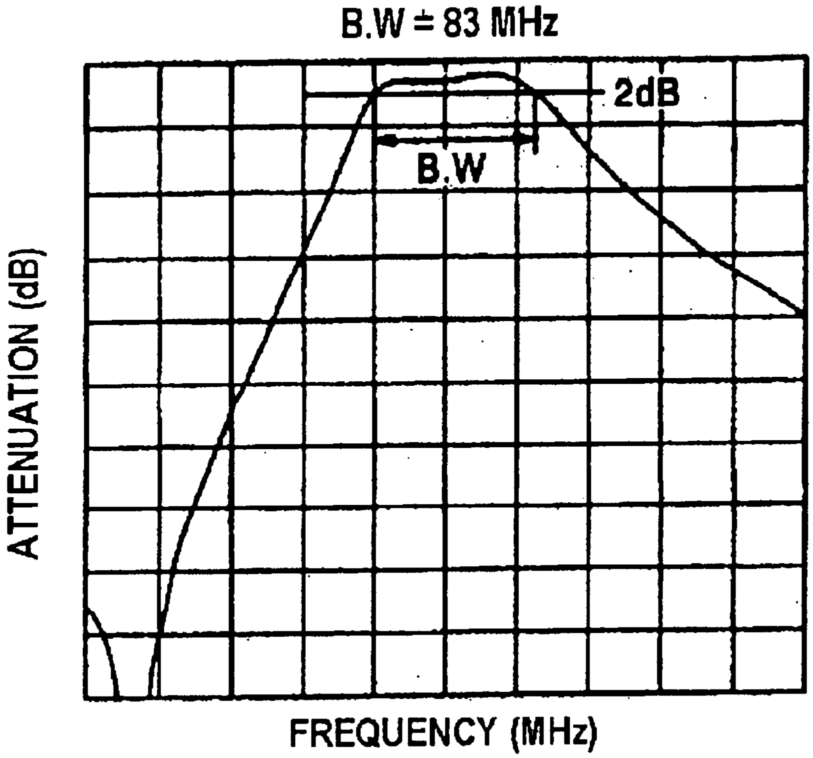
FIG. 3 is a graph showing the filter characteristics of the dielectric filter of FIG. 1.
Figure 8:
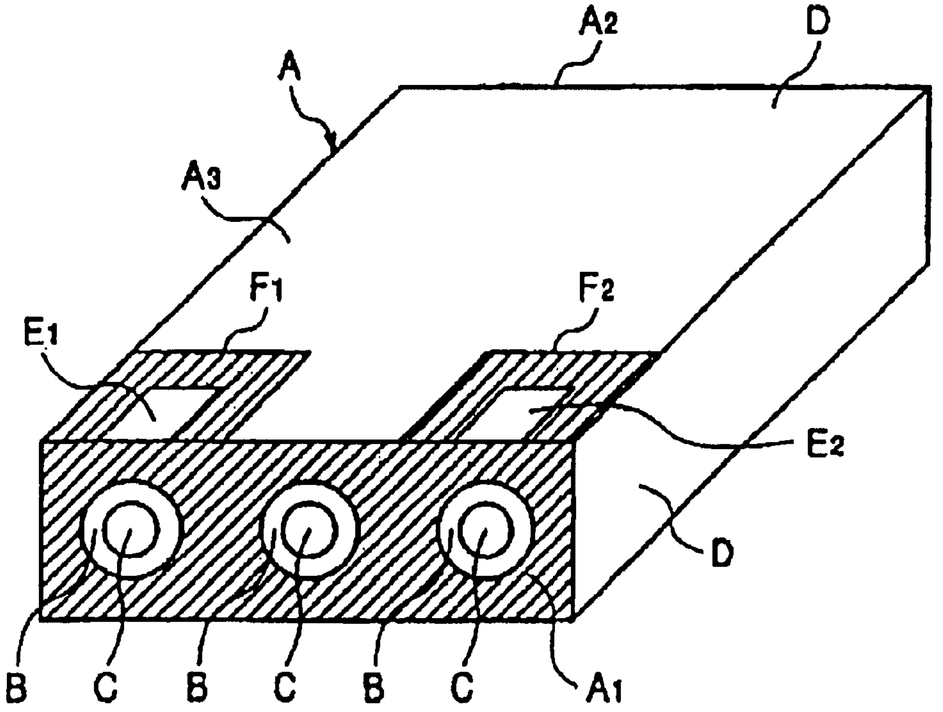
FIG. 8, which was described above, is a perspective view of an exemplary conventional (prior art) dielectric filter.
Figure 9:
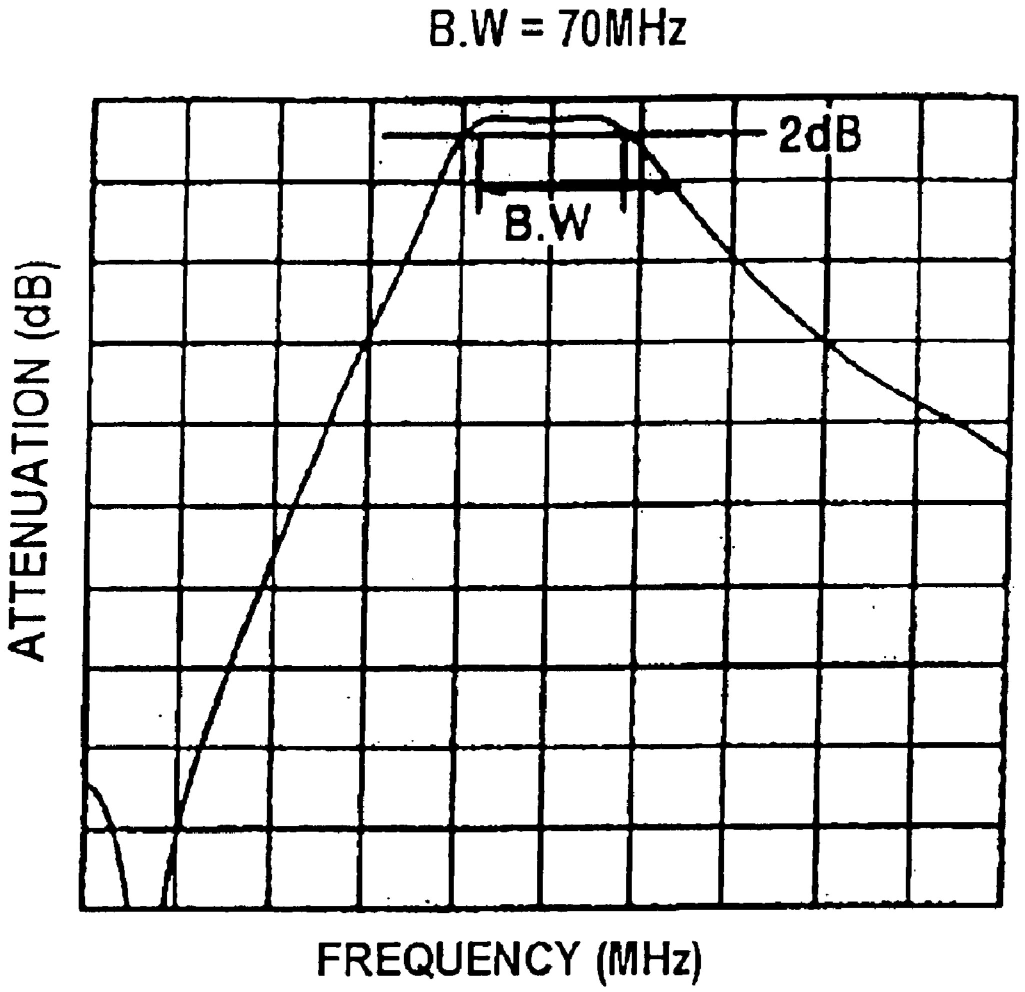
FIG. 9, which was also described above, is a graph showing filter characteristics of the dielectric filter of FIG. 8.

FIG. 3 shows the filter characteristics of the dielectric filter according to the embodiment shown in FIGS. 1 and 2. As is clear from FIG. 3, the dielectric filter has a 2-dB band width (B.W.), i.e., a frequency band width at an attenuation level 2 dB lower than 0 dB as viewed in the graph, of 83 MHz. This bandwidth is broader, by 13 MHz, than the bandwidth (70 MHz) shown in FIG. 9 for the conventional dielectric filter of FIG. 8 in which no conductor-absent section is provided between the insulating sections 8*a* and 8*b* defining the input-output terminals 7*a* and 7*b*.

Figure 4:
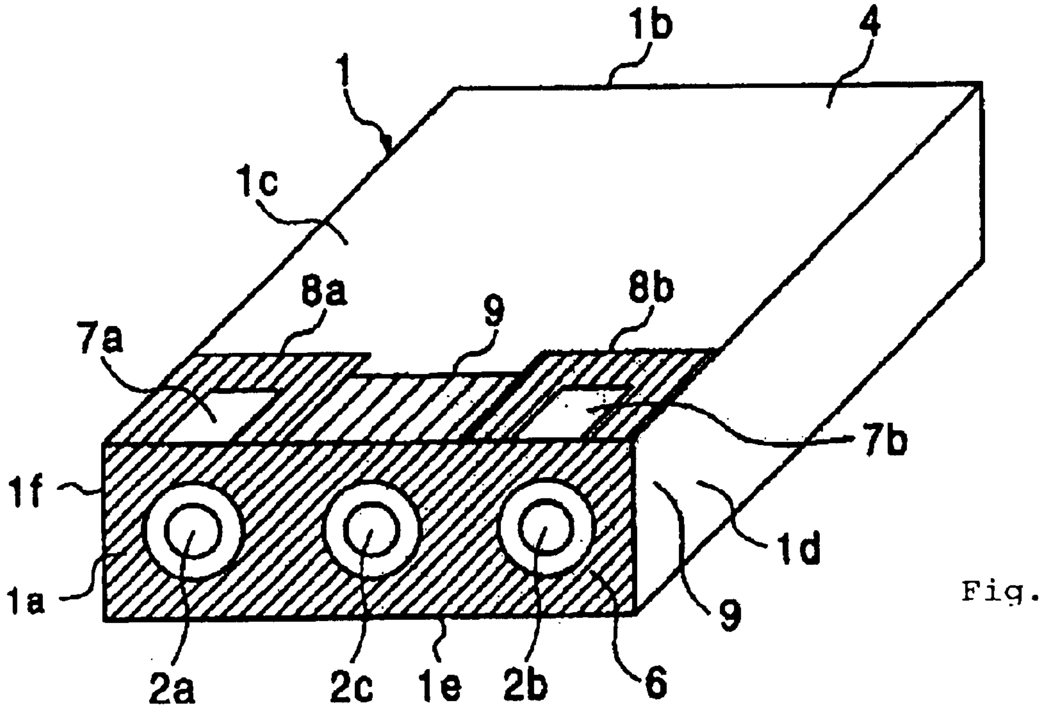
FIG. 4 is a perspective view of a three-stage dielectric filter for high-frequency use, according to another embodiment of the present invention.
Figure 5:
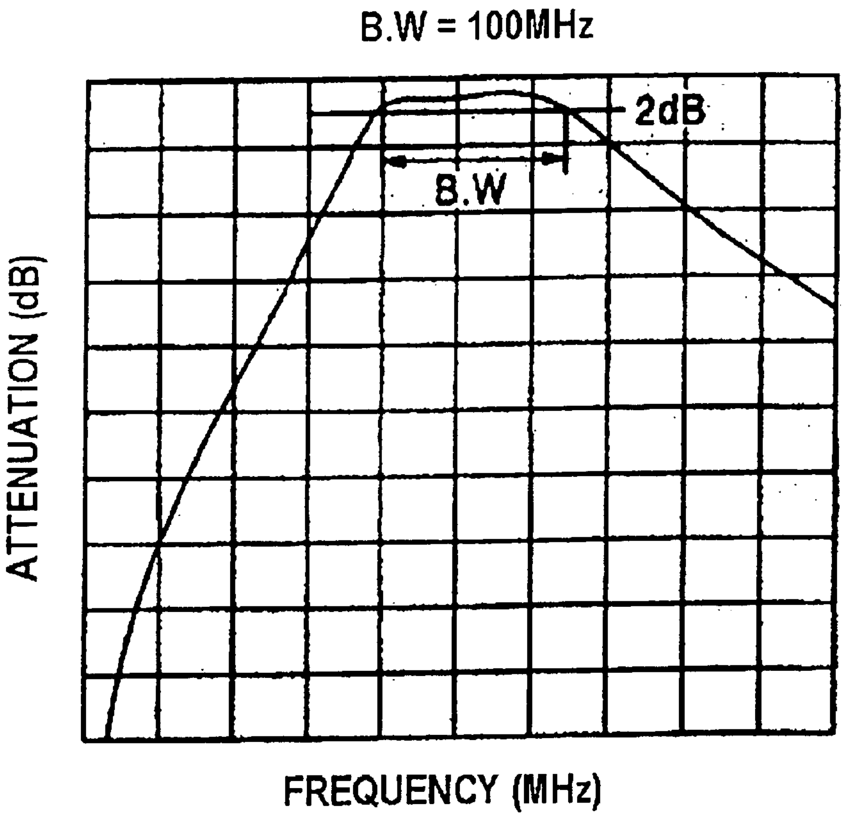
FIG. 5 is a graph showing filter characteristics of the dielectric filter of FIG. 4.

FIG. 4 shows another embodiment of the present invention. In this embodiment, a conductor-absent section 9 extends from the edge between the side surface and the open end surface 6, along the insulating sections 8*a* and 8*b*, to a terminating point beyond the inner ends of the input-output terminals 7*a* and 7*b* (as measured in the longitudinal direction of the device). As shown in FIG. 5, which illustrates the filter characteristics of this embodiment, a broad band width of 100 MHz (B.W.=100 MHz) can be obtained.

Figure 6:
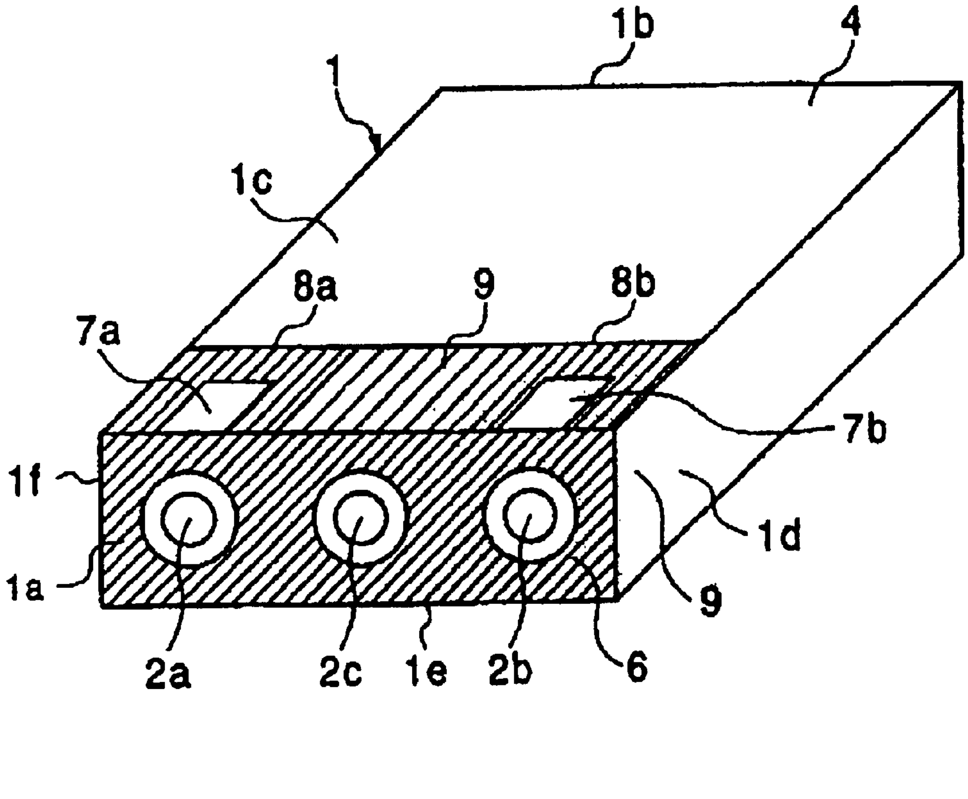
FIG. 6 is a perspective view of a three-stage dielectric filter for high-frequency use, according to still another embodiment of the present invention.
Figure 7:
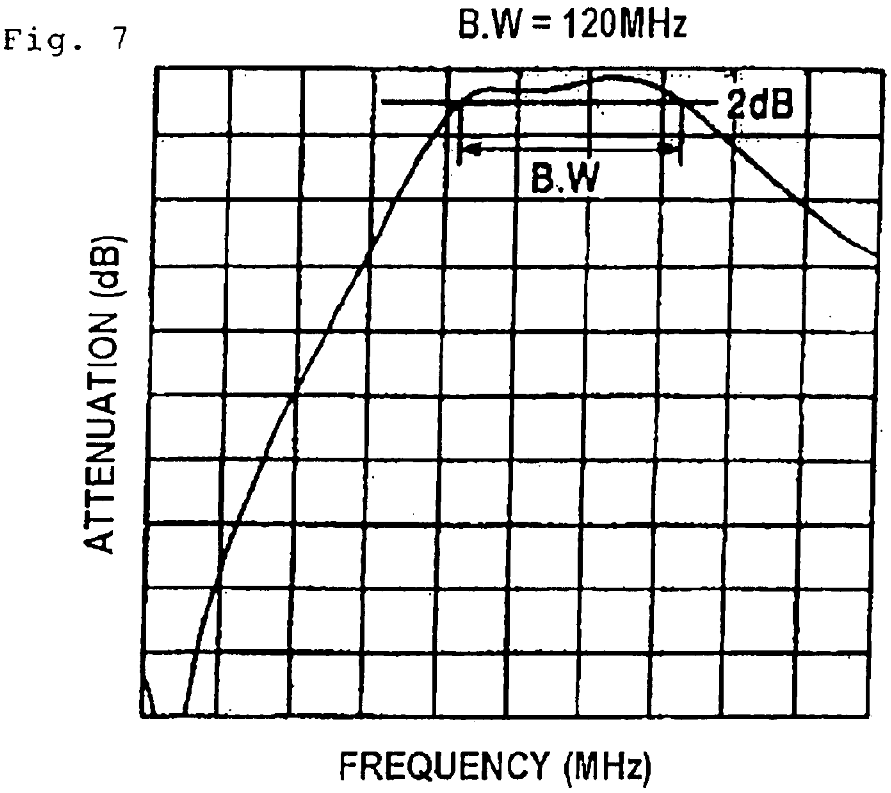
FIG. 7 is a graph showing filter characteristics of the dielectric filter of FIG. 6.

FIG. 6 shows still another embodiment of the present invention. In this embodiment, a conductor-absent section 9 extends from the edge between the side surface and the open end surface 6, along the insulating sections 8*a* and 8*b*, to a point corresponding to the inner end of the insulating sections (again, as measured in the longitudinal direction). As shown in FIG. 7 which illustrates the filter characteristics of the embodiment, a broad band width, B.W.=120 MHz, can be obtained.

Although the aforementioned embodiments of the present invention are directed to three-stage dielectric filters for high-frequency use having three dielectric resonators, the present invention can also be applied to two-stage dielectric filters for high-frequency use having two dielectric resonators as well as to dielectric filters for high-frequency use having four or more stages.

As has been described hereinabove, the dielectric filter according to the present invention includes a dielectric block having side and end surfaces; a plurality of resonators provided in the dielectric block in parallel to each other, each resonator comprising an inner conductor on a wall surface of a through-hole extending from a first end surface of the dielectric block to a second end surface of the dielectric block opposite the first end surface; and an outer conductor on the side and end surfaces of the dielectric block except for the first end surface, the inner conductor on the wall surface of each through-hole and the outer conductor on the side and end surfaces of the dielectric block are connected with each other so that the second end surface serves as a short circuit end surface, and the first end surface serves as an open end surface. A pair of input-output terminals are provided on a side surface of the dielectric block such that the input-output terminals are located adjacent to the open end surface at respective positions corresponding to open ends of two of said resonators. Insulating sections are provided on the side surface in such a manner that each insulating section isolates corresponding one of the input-output terminals from the outer conductor formed on the side surface of the dielectric block. A conductor-absent section for controlling the filter characteristics of the dielectric filter, i.e., a section wherein no conductor is present, is provided on the side surface so as to be located between the input-output terminals, the conductor-absent section extending from an edge between the side surface and the open end surface, along the insulating sections, over a predetermined distance. As discussed above, with this construction, a dielectric filter is provided which has broadband characteristics and in which magnetic field coupling is prevented.

Although the invention has been described above in relation to preferred embodiments thereof, it will be understood by those skilled in the art that variations and modifications can be effected in these preferred embodiments without departing from the scope and spirit of the invention.

What is claimed:

1. A dielectric filter comprising:

a dielectric block including side and end surfaces;

a plurality of resonators provided in the dielectric block in parallel with each other, each of said resonators comprising an inner conductor on a wall surface of a through-hole extending from a first end surface of the dielectric block to a second end surface of the dielectric block opposite the first end surface; and an outer conductor on the side and end surfaces of the dielectric block except for the first end surface, the inner conductor on the wall surface of each through-hole and the outer conductor on the circumferential surface of the dielectric block being connected together so that the second end surface serves as a short circuit end surface, and the first end surface serves as an open end surface; and the dielectric filter further comprising:

a pair of input-output terminals disposed on one side surface of the dielectric block such that the input-output terminals are located adjacent to the open end surface at respective positions corresponding to open ends of two of said resonators;

insulating sections on said one side surface, each of said insulating sections isolating a corresponding one of the input-output terminals from the outer conductor on said one side surface of the dielectric block; and a further section without a conductor thereon for controlling filter characteristics of said dielectric filter, said further section being located on said one side surface so as to be disposed between the input-output terminals, and extending over a predetermined distance along the insulating sections from an edge between said one side surface and the open end surface.

2. A dielectric filter as claimed in claim 1, wherein the said section for controlling the filter characteristics of the filter is of such dimensions so as to prevent magnetic field coupling between said resonators.

3. A dielectric filter as claimed in claim 1, wherein said section for controlling filter characteristics of the filter is formed by removing a portion of the outer conductor formed on said one side surface of the dielectric block.

4. A dielectric filter as claimed in claim 1 wherein said further section bridges and interconnects said insulating sections.

5. A dielectric filter comprising: a dielectric block including side and end surfaces;

a plurality of resonators provided in the dielectric block in parallel with each other, each of said resonators comprising an inner conductor on a wall surface of a through-hole extending from a first end surface of the dielectric block to a second end surface of the dielectric block opposite the first end surface; and an outer conductor on said side and end surfaces of the dielectric block except for the first end surface;

the inner conductor on the wall surface of each through-hole and the outer conductor on the circumferential surface of the dielectric block being connected together so that the second end surface serves as a short circuit end surface, and the first end surface serves as an open end surface; and the dielectric filter further comprising:

a pair of terminals disposed on one side surface of the dielectric block such that the input-output terminals are located adjacent to the open end surface at respective positions corresponding to open ends of two resonators;

insulating sections on said one side surface, each of said insulating sections isolating a corresponding one of the terminals from the outer conductor on the side surface of the dielectric block; and a further section without a conductor thereon for controlling filter characteristics of said dielectric filter, said further section being located on said one side surface so as to be disposed between the terminals, and being formed by removing part of the outer conductor so as to expose a corresponding part of said one side surface.

6. A dielectric filter as claimed in claim 5, wherein said further section bridges and interconnects said insulating sections.

* * * * *